United States Patent
McDougall, Jr. et al.

(10) Patent No.: US 12,181,502 B2
(45) Date of Patent: *Dec. 31, 2024

(54) SYSTEM AND METHOD FOR DETECTING ARC IN AN ELECTRICAL METER

(71) Applicant: Aclara Technologies LLC, St. Louis, MO (US)

(72) Inventors: Thomas Lee McDougall, Jr., Milton, NH (US); Curtis Whitmore Crittenden, Milton, NH (US); Charles Andrew Waters, Durham, NH (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/487,250

(22) Filed: Oct. 16, 2023

(65) Prior Publication Data
US 2024/0061028 A1    Feb. 22, 2024

Related U.S. Application Data

(63) Continuation of application No. 17/193,298, filed on Mar. 5, 2021, now Pat. No. 11,789,050.

(60) Provisional application No. 62/985,964, filed on Mar. 6, 2020.

(51) Int. Cl.
*G06F 11/30* (2006.01)
*G01R 22/06* (2006.01)

(52) U.S. Cl.
CPC ......... *G01R 22/068* (2013.01); *G01R 22/063* (2013.01)

(58) Field of Classification Search
CPC .................................................... G01R 22/068
See application file for complete search history.

(56) References Cited

U.S. PATENT DOCUMENTS

| | | | | |
|---|---|---|---|---|
| 6,621,669 B1 * | 9/2003 | Haun | .................... | H01H 71/125 361/42 |
| 10,054,631 B2 * | 8/2018 | Lawton | ................. | G01R 22/068 |
| 11,789,050 B2 * | 10/2023 | McDougall, Jr. | .... | G01R 22/068 702/62 |
| 2005/0203672 A1 * | 9/2005 | Restrepo | ............... | H02H 1/0015 700/293 |
| 2013/0044395 A1 * | 2/2013 | Rodgers | ............... | H02H 1/0092 361/42 |
| 2014/0327449 A1 * | 11/2014 | Shuey | .................. | G01R 22/068 324/538 |

OTHER PUBLICATIONS

PCT/US2021/021061 International Search Report and Written Opinion dated May 21, 2021 (14 pages).

* cited by examiner

*Primary Examiner* — Phuong Huynh
(74) *Attorney, Agent, or Firm* — Michael Best & Friedrich LLP

(57) ABSTRACT

An electrical meter including a housing including a socket interface operable to connect to a facility. The meter further including a sensor configured to sense a characteristic of the electrical meter. The meter further including a controller having an electronic processor and a memory. The electronic processor is configured to receive, from the sensor, a signal indicative of the electrical characteristic, determine, based on the signal, presence of a hot socket, and output an alert based on determining presence of the hot socket.

18 Claims, 3 Drawing Sheets

SYSTEM AND METHOD FOR DETECTING ARC IN AN ELECTRICAL METER

RELATED APPLICATIONS

This application is a continuation of U.S. patent application Ser. No. 17/193,298, filed on Mar. 5, 2021, now U.S. Pat. No. 11,789,050, which claims the benefit of priority to U.S. Provisional Patent Application No. 62/985,964, filed on Mar. 6, 2020, the entire contents of each of which are incorporated herein by reference.

FIELD

Embodiments relate to electrical meters.

SUMMARY

Electrical meters may be installed at facilities (for example, homes, businesses, etc.) serviced by an electrical utility to measure an amount of electricity consumed by said facility. The electrical meters are electrically coupled to the facility via a socket, or electrical socket. Poor socket connections may lead to electrical arcing. Currently, electrical meter service to inspect and correct poor socket connections is performed according to a schedule. However, such methods may result in poor socket connections being present for long durations of time and/or being missed.

Thus, one embodiment provides an electrical meter including a housing with a socket interface operable to connect to a facility. The meter further includes a sensor configured to sense a characteristic of the electrical meter. The meter further includes a controller having an electronic processor and a memory. The electronic processor is configured to receive, from the sensor, a signal indicative of the electrical characteristic, determine, based on the signal, presence of a hot socket, and output an alert based on determining presence of the hot socket.

Another embodiment provides a method for detecting a hot socket in an electrical meter. The method includes sensing, via a sensor, a characteristic of the electrical meter, and receiving, via a controller having an electronic processor, a signal indicative of the electrical characteristic. The method further includes determining, via the controller and based on the signal, presence of a hot socket, and outputting, via the controller, an alert based on determining presence of the hot socket.

Other aspects of the disclosure will become apparent by consideration of the detailed description and accompanying drawings.

DETAILED DESCRIPTION

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

Figure 1:
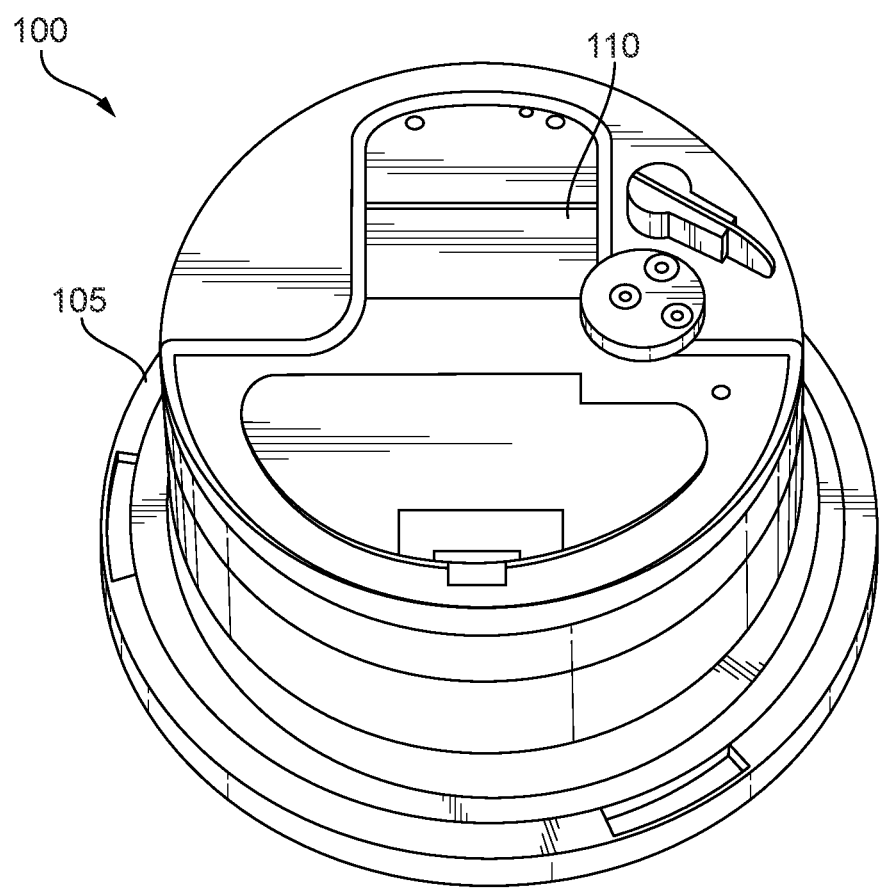
FIG. 1 is a perspective view illustrating an electrical meter according to some embodiments.
Figure 2:
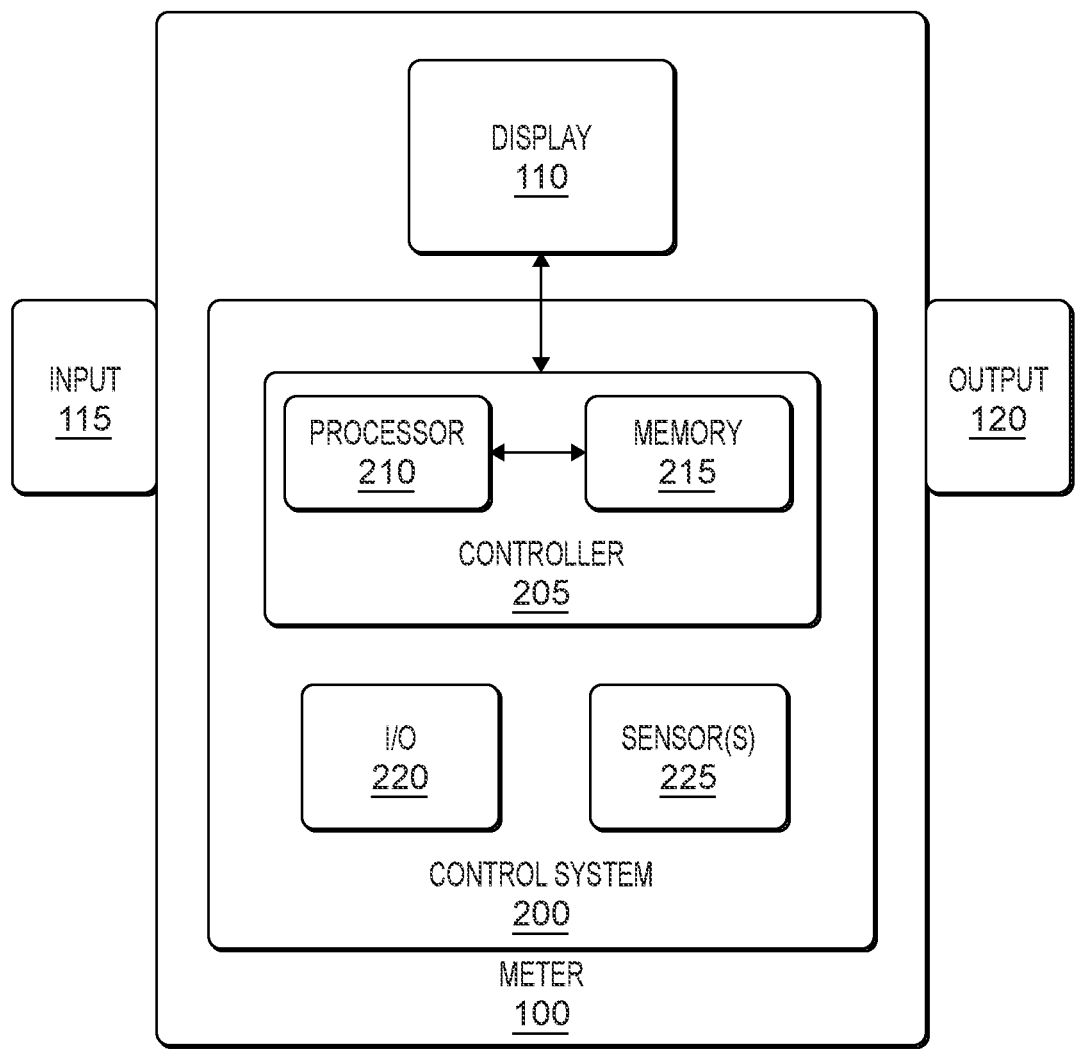
FIG. 2 is a block diagram illustrating the electrical meter of FIG. 1 according to some embodiments.

FIG. 1 illustrates a utility meter 100 according to some embodiments. The utility meter 100 may be configured to measure utility consumption (for example, electrical consumption) by a user (for example, a residential user or a commercial user). The utility meter 100 may include a housing 105 and a display 110. The housing 105 may include various electrical and electronic components of the utility meter 100, such as but not limited to, an input 115 (FIG. 2) and an output 120 (FIG. 2). The input 115 may be configured to receive electricity from a utility, while the output 120 may be configured to output the electricity for user consumption. The display 110 may be configured to output information to a user. The display 110 may be any suitable display, for example, a liquid crystal display (LCD) touch screen, or an organic light-emitting diode (OLED) touch screen FIG. 2 is a block diagram illustrating the utility meter 100 according to some embodiments. In the illustrated embodiment, the utility meter 100 further includes a control system 200 including a controller 205. In some embodiments, the control system 200 is implemented wholly or partially on a printed-circuit board contained within the housing 105.

The controller 205 may have a plurality of electrical and electronic components that provide power, operational control, and protection to the components. For example, but not limited to, an electronic processor 210 and a memory 215. The electronic processor 210 obtains and provides information (for example, from the memory 215), and processes the information by executing one or more software instructions or modules, capable of being stored, for example, in a random access memory ("RAM") area of the memory 215 or a read only memory ("ROM") of the memory 215 or another non-transitory computer readable medium (not shown). The software can include firmware, one or more applications, program data, filters, rules, one or more program modules, and other executable instructions. The memory 215 can include one or more non-transitory computer-readable media, and includes a program storage area and a data storage area. The program storage area and the data storage area can include combinations of different types of memory, as described herein. The electronic processor 210 is configured to retrieve from the memory 215 and execute, among other things, software related to the control processes and methods described herein.

The controller 205 may be electrically and/or communicatively connected to a variety of modules and/or components of the utility meter 100. For example, the controller 205 may be electrically and/or communicatively coupled to an input/output (I/O) interface 220 and one or more sensors 225.

The I/O interface 220 may be configured to receive input and/or provide output to one or more external devices. For example, the I/O interface 220 may obtain information and signals from, and provide information and signals to, (for example, over one or more wired and/or wireless connections) external devices. The external devices may include, but are not limited to, one or more servers, an external computer, a smart phone, and/or a tablet. In some embodiments, the I/O interface 220 is, or includes, an advanced metering infrastructure (AMI) module and/or a network interface controller (NIC).

The one or more sensors 225 may be configured to sense one or more characteristics of the meter 100. In some embodiments the one or more sensors 225 are configured to sense one or more electrical characteristics. In such an embodiment, the one or more electrical characteristics may include a voltage, a current, a power, and/or a temperature. In other embodiments, the one or more sensors 225 are configured to sense acoustical information of the meter 100. In yet other embodiments, the one or more sensors 225 are configured to sense environmental characteristics (for example, ozone) of the meter 100. In yet other embodiments, the one or more sensors 225 are configured to sense radio-frequency information.

In one embodiment of general operation, the meter 100 is configured to detect/determine presence of a hot socket (for example, a hot socket at input 115 and/or output 120). In some embodiments, the one or more sensors 225 sense a characteristic of the meter 100. In such an embodiment, the controller 205 receives a signal indicative of the sensed characteristic, and determines, based on the signal, presence of a hot socket. In some embodiments, the controller 205 outputs an alert based on determining presence of a hot socket.

Figure 3:
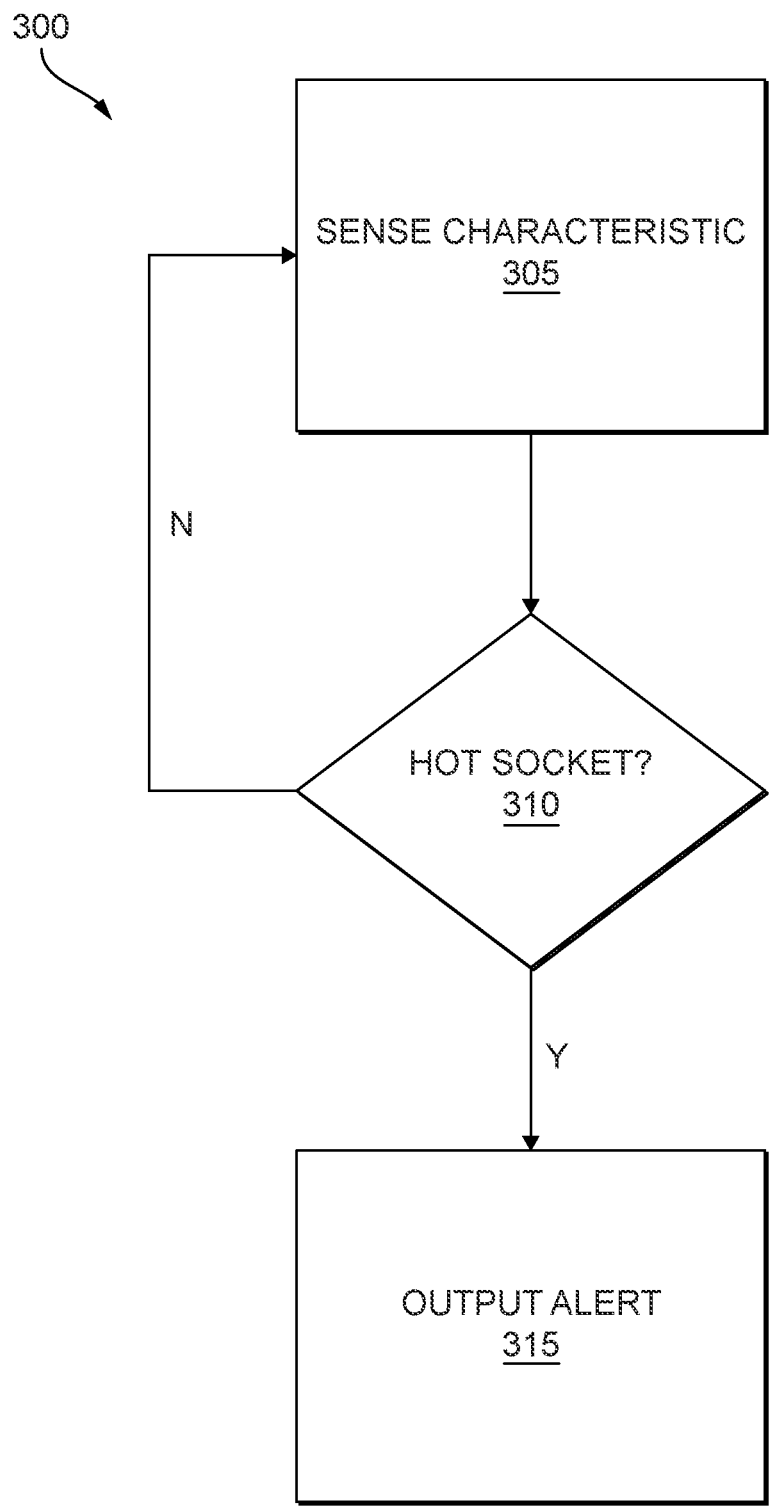
FIG. 3 is a flowchart illustrating a process of the electrical meter of FIG. 1 according to some embodiments.

FIG. 3 is a flowchart of a process 300 according to some embodiments. It should be understood that the order of the steps disclosed in process 300 could vary. Furthermore, additional steps may be added to the sequence and not all of the steps may be required. In some embodiments, process 300 is performed by control system 200 and/or controller 205.

A characteristic of the electrical meter 100 is sensed (block 305). Presence of a hot socket is determined based on the sensed characteristic (block 310). In some embodiments, presence of a hot socket is determined based on comparing the sensed characteristic to a predetermined threshold. In such an embodiment, presence of a hot socket may further be determined based on the sensed characteristic surpassing a predetermined threshold for a predetermined time period. If no hot socket is determined to be present, process 300 cycles back to block 305. If a hot socket is determined to be present, an alert is output (block 310). In some embodiments, the alert is output to a user and/or the utility company. In some embodiments, in addition to or in lieu of outputting an alert, the meter 100 may disconnect the power supply upon determining presence of a hot socket.

In some embodiments, determining presence of a hot socket includes determining presence of an arcing condition. In one embodiment, the one or more sensors 225 sense an electrical characteristic (for example, a voltage, a current, a power, and/or a temperature) in order for the meter 100 to determine presence of a hot socket. In some embodiments, the electrical characteristic may be a load current and/or a line current. In such an embodiment, a root-mean-square (RMS) value of one or more cycles of the current may be calculated. The calculated RMS value may then be compared to a predetermined threshold to determine presence of an arcing condition and/or a hot socket.

In some embodiments, the meter 100 is configured to identify false positives, such as but not limited to, false positives resulting from an in-rush condition and/or a steady-state condition. An in-rush condition may be an indication of the presence of a normally operating load. An in-rush condition may exist when there is a relatively large change in current from an initially non-conductive state, followed by an exponential-like decrease of the current over a plurality of cycles. Although a sensed electrical characteristic may cross a predetermined threshold during an in-rush condition, an arcing condition and/or a hot socket may not be present. Thus, the meter 100 may be configured to identify an in-rush condition and rule out presence of an arcing condition and/or a hot socket.

A steady-state condition may be an indication of the presence of a normally operating load. A steady-state condition may exist where there is a relatively small variation in current (for example, a variation that is within +/−0.5-Arms) for a plurality of cycles (for example, fifteen) and/or the relative change in the correlation coefficient calculated between contiguous cycles falls within an envelope of acceptance for each cycle within a plurality of cycles (for example, fifteen). Although a sensed electrical characteristic may cross a predetermined threshold during a steady-state condition, an arcing condition and/or a hot socket may not be present. Thus, the meter 100 may be configured to identify a steady-state condition and rule out presence of an arcing condition and/or a hot socket.

In some embodiments, the one or more sensors 225 are acoustic sensors. In such an embodiment, the one or more sensors 225 are configured to sense acoustic levels within and/or external the housing 105. Acoustic level(s) crossing a predetermined threshold may indicate presence of a hot socket (and/or an arcing condition) is present.

In some embodiments, the one or more sensors 225 are environmental sensors. In such an embodiment, the one or more sensors 225 may be ozone sensors configured to sense an ozone level within and/or external the housing 105. Ozone level(s) crossing a predetermined threshold may indicate presence of a hot socket (and/or presence of an arcing condition).

In some embodiments, the meter 100 (including the control system 200 and/or I/O interface 220) is configured to communicate with one or more external devices using one or more radio-frequency channels (or band). In such an embodiment, the control system 200 may be configured to monitor radio-frequency noise (for example, by monitoring the noise floor at predetermined intervals (for example, every five minutes, ten minutes, fifteen minutes, etc.)).

The control system 200 may further be configured to determine presence of a hot socket based on the monitored noise floor (for example, by monitoring an increase in the noise floor). In some embodiments, the control system 200 monitors the noise floor, and upon monitoring a noise having a magnitude above a predetermined threshold and/or a frequency within a predetermined range, determine presence of a hot socket.

In some embodiments, the control system 200 may receive sensed characteristics from two or more sensors 225 in conjunction to determine presence of a hot socket. In such an embodiment, the control system 200 may determine presence of a hot socket based on two or more sensed characteristics (for example, from two or more different sensors 225), along with one or more algorithms. In some embodiments, the algorithm uses a decision-tree, a look-up table, and/or weighting system that weights characteristics according to importance. Such embodiments may be used to prevent false positives of hot socket detection.

Embodiments provide, among other things, a utility meter with arc detection capabilities. Various features and advantages of the application are set forth in the following claims.

What is claimed is:

1. An electrical meter comprising:
   a housing including a socket interface operable to connect to a facility;
   a sensor configured to sense a characteristic of the electrical meter; and
   a controller having an electronic processor and a memory, the electronic processor configured to:

receive, from the sensor, a signal indicative of the characteristic, determine, based on the signal, a presence of a hot socket, wherein the presence of the hot socket is based on the characteristic being above a predetermined threshold for a predetermined time period, determine, based on the signal, if the determination of the presence of the hot socket is a false positive, and output an alert when the determination of the presence of the hot socket is not a false positive.

2. The electrical meter of claim 1, wherein the characteristic is at least one selected from a group consisting of an electrical characteristic, a radio-frequency, an ozone characteristic, and an acoustic characteristic.

3. The electrical meter of claim 2, wherein the electrical characteristic is at least one selected from a group consisting of a voltage, a current, and a temperature.

4. The electrical meter of claim 2, wherein the radio-frequency is a radio-frequency noise.

5. The electrical meter of claim 1, wherein the controller is further configured to determine, based on the signal, a presence of an arcing condition.

6. The electrical meter of claim 5, wherein the controller is further configured to determine, based on the signal, a presence of a series arcing condition.

7. The electrical meter of claim 5, wherein the controller is further configured to determine, based on the signal, a presence of a parallel arcing condition.

8. The electrical meter of claim 1, wherein the alert is received by a server.

9. The electrical meter of claim 8, wherein the server is configured to receive a second alert from a second electrical meter located at a second facility.

10. A method for detecting a hot socket in an electrical meter, the method comprising:

sensing, via a sensor, a characteristic of the electrical meter;

receiving, via a controller having an electronic processor, a signal indicative of the characteristic;

determining, via the controller and based on the signal, a presence of a hot socket, wherein the presence of the hot socket is based on the characteristic being above a predetermined threshold for a predetermined time period;

determining, via the controller and based on the signal, if the determination of the presence of the hot socket is a false positive, and outputting, via the controller, an alert when the determination of the presence of the hot socket is not a false positive.

11. The method of claim 10, wherein the characteristic is at least one selected from a group consisting of an electrical characteristic, a radio-frequency, an ozone characteristic, and an acoustic characteristic.

12. The method of claim 11, wherein the electrical characteristic is at least one selected from a group consisting of a voltage, a current, and a temperature.

13. The method of claim 11, wherein the radio-frequency is a radio-frequency noise.

14. The method of claim 10, wherein the controller is further configured to determine, based on the signal, a presence of an arcing condition.

15. The method of claim 14, wherein the controller is further configured to determine, based on the signal, a presence of a series arcing condition.

16. The method of claim 14, wherein the controller is further configured to determine, based on the signal, a presence of a parallel arcing condition.

17. The method of claim 10, wherein the alert is received by a server.

18. The method of claim 17, wherein the server is configured to receive a second alert from a second electrical meter located at a second facility.

* * * * *